United States Patent [19]
Laskaris et al.

[11] Patent Number: 5,304,934
[45] Date of Patent: Apr. 19, 1994

[54] SUPERCONDUCTING MAGNET FOR IMAGING HUMAN LIMBS

[75] Inventors: Evangelos T. Laskaris, Schenectady; Bizhan Dorri, Clifton Park; Kenneth G. Herd, Schenectady, all of N.Y.

[73] Assignee: General Electric Company, Schenectady, N.Y.

[21] Appl. No.: 302

[22] Filed: Jan. 4, 1993

[51] Int. Cl.$^5$ ............................................. G01R 33/20
[52] U.S. Cl. ...................................... 324/318; 324/319
[58] Field of Search ................. 335/216, 301; 62/47.1, 62/50.2, 51.1; 324/320, 318, 319, 322, 300, 309, 307

[56] References Cited
U.S. PATENT DOCUMENTS

| | | | |
|---|---|---|---|
| 4,800,354 | 1/1989 | Laskaris | 335/216 |
| 4,924,198 | 5/1990 | Laskaris | 335/216 |
| 5,001,448 | 3/1991 | Srivastava et al. | 335/301 |
| 5,045,794 | 9/1991 | Dorri et al. | 324/320 |
| 5,129,232 | 7/1992 | Minal et al. | 62/51.1 |
| 5,153,546 | 10/1992 | Laskaris | 335/216 |
| 5,201,184 | 4/1993 | Roth | 62/47.1 |
| 5,210,512 | 5/1993 | Davies | 335/216 |

Primary Examiner—Michael J. Tokar
Attorney, Agent, or Firm—Paul R. Webb, II

[57] ABSTRACT

This invention relates to a superconducting magnet of the type that has a relatively small imaging volume. Such structures of this type, generally, allow the operator to image human limbs without the use of a larger, more costly superconducting magnet.

11 Claims, 12 Drawing Sheets

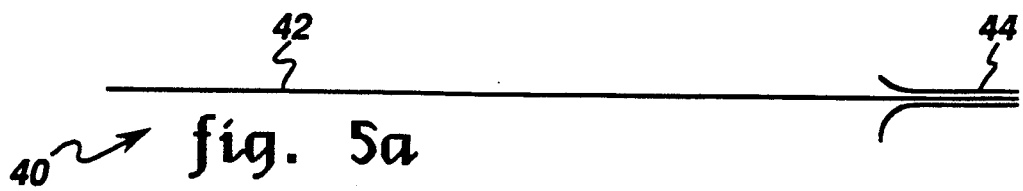
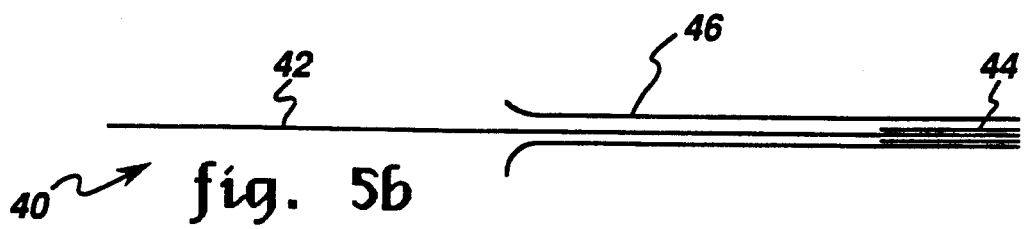
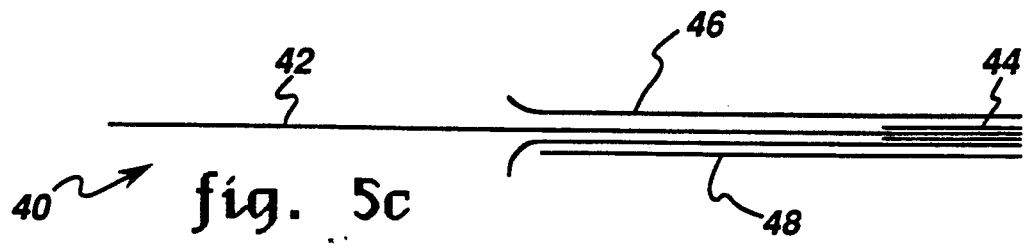
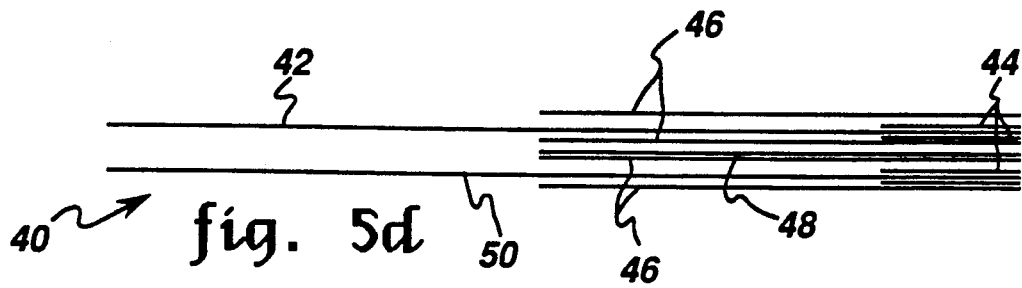
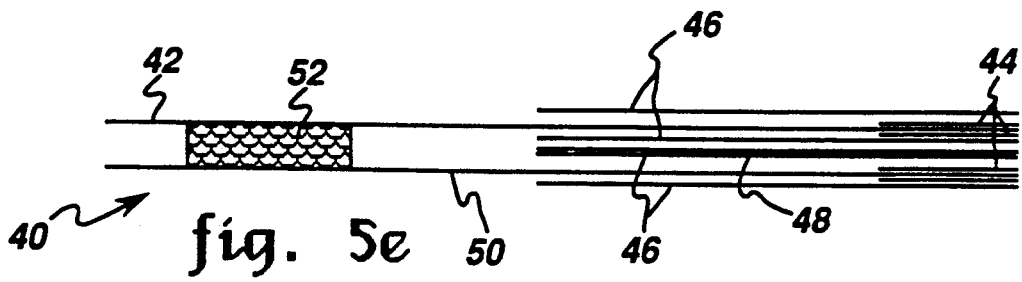
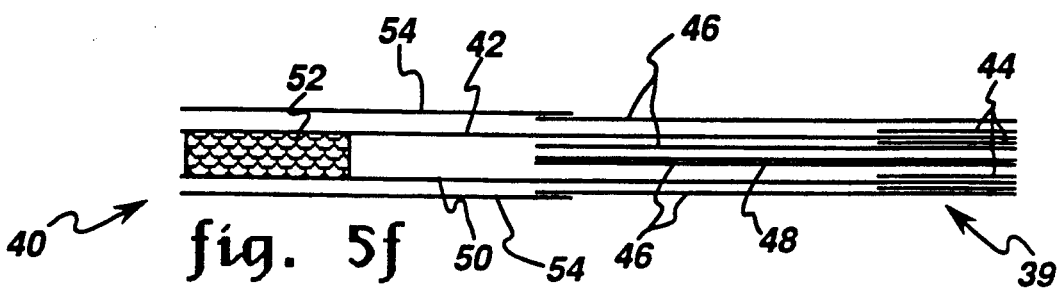

SUPERCONDUCTING MAGNET FOR IMAGING HUMAN LIMBS

BACKGROUND OF THE INVENTION

1. Field of the Invention

This invention relates to a superconducting magnet of the type that has a relatively small imaging volume. Such structures of this type, generally, allow the operator to image human limbs without the use of a larger, more costly superconducting magnet.

2. Description of the Related Art

It is known, in superconducting magnets, to employ large, whole body magnetic resonance (MR) imaging systems to image human limbs. Exemplary of such prior art MR imaging systems, achieving a modicum of success in this regard, are U.S. Pat. Nos. 4,924,198 and 5,153,456, entitled "Superconductive Magnetic Resonance Magnet without Cryogens" and "Open MRI Magnet", respectively, both to E. T. Laskaris and both assigned to the same assignee as the present invention. While these MR imaging systems have met with a high degree of commercial success, they are made up, of necessity, of large, whole body MR imaging systems. Also, these devices are expensive and basically built for imaging heads and spines. A more advantageous superconducting imaging system, then, would be presented if the superconducting system were dedicated only to the imaging of human limbs while providing a compact and inexpensive superconducting imaging system.

It is apparent from the above that there exists a need in the art for a superconducting imaging system which is light weight and compact through simplicity of parts and uniqueness of structure, and which at least equals the superconducting imaging characteristics of the known MR imaging systems, particularly those of the highly advantageous type disclosed in the above-referenced Laskaris patents, but which at the same time is specifically designed for the imaging of human limbs. It is a purpose of this invention to fulfill this and other needs in the art in a manner more apparent to the skilled artisan once given the following disclosure.

SUMMARY OF THE INVENTION

Generally speaking, this invention fulfills these needs by providing an eddy-current free, superconducting magnet for imaging human limbs, comprising a superconducting coil means operatively connected to a cartridge means, a thermal shield means operatively connected to and substantially surrounding said cartridge means, a bore tube means which substantially surrounds said thermal shield means, a gradient coil/passive shimming means operatively connected to said tube means, a RF shield means operatively connected to said gradient coil/passive shimming means, a RF coil means located at a predetermined distance away from said RF shield means such that said RF coil means substantially surrounds a relatively small imaging volume, a cooling means operatively connected to said cartridge means and said thermal shield means, and superconducting lead means for energizing said magnet.

In certain preferred embodiments, the cartridge means, thermal shield means, and the bore tube means are constructed of an epoxy-reinforced fiberglass and copper wire. Also, the imaging volume is approximately 10 centimeters in diameter. Finally, the cooling means is a cryocooler.

In another preferred embodiment, human limbs can be imaged by a superconducting imaging system which is both compact and inexpensive.

The preferred superconducting imaging system for human limbs, according to this invention, offers the following advantages: lightness in weight; excellent superconducting characteristics; excellent imaging of human limbs; reduced size; good stability; good durability; good economy; and high strength for safety. In fact, in many of the preferred embodiments, these factors of superconducting characteristics, the imaging of human limbs and reduced size are optimized to an extent that is considerably higher than heretofore achieved in prior, known superconducting imaging magnets.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several veins and in which:

FIGS. 5a–5f illustrate the methods for making a superconducting joint for the eddy-current free, superconducting imaging magnet for imaging human limbs, according to the present invention;

DETAILED DESCRIPTION OF THE INVENTION

Figure 1:
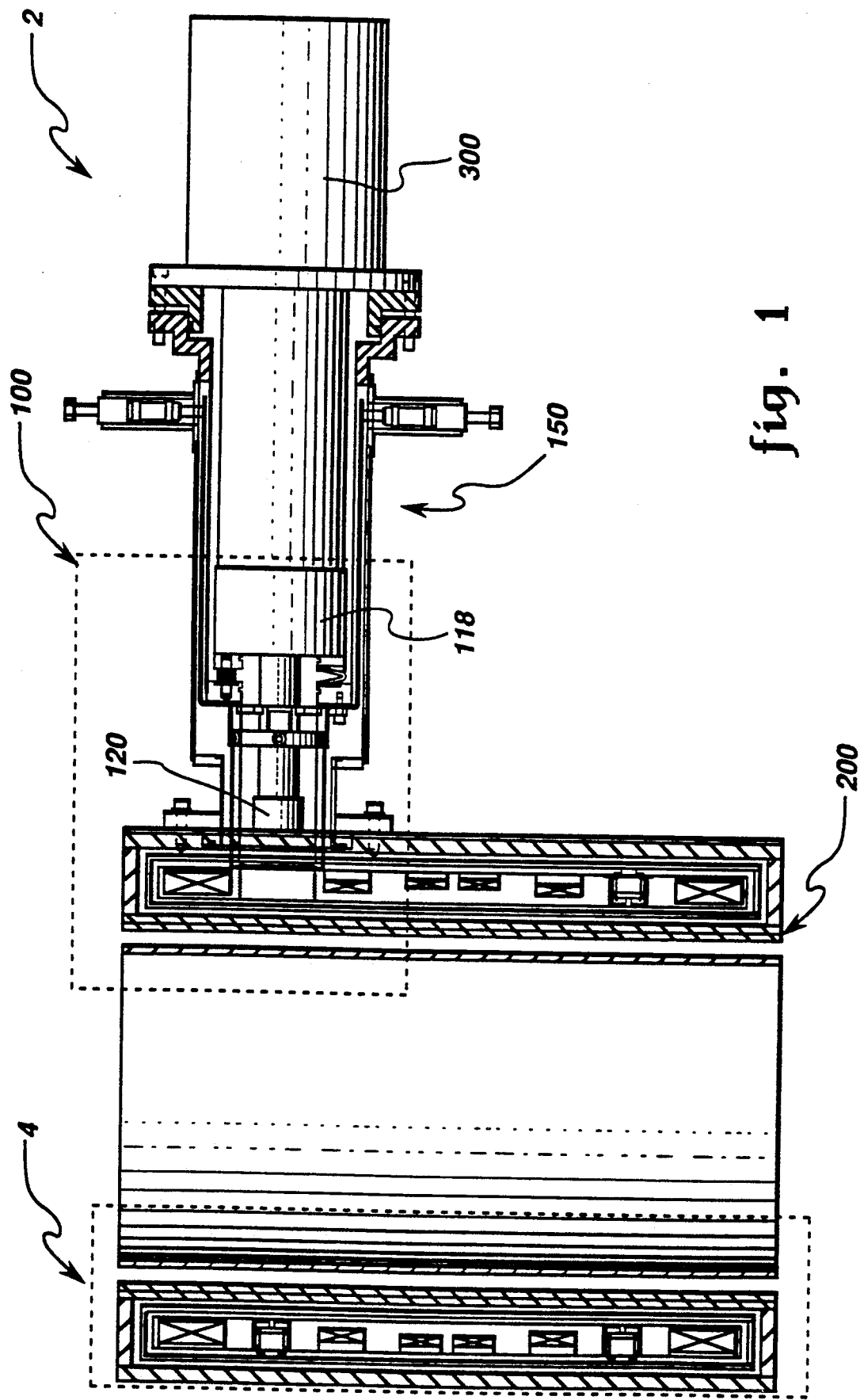
FIG. 1 is a top plan view of an eddy-current free, superconducting imaging magnet for human limbs, according to the present invention.

With reference first to FIG. 1, there is illustrated eddy-current free, superconducting imaging magnet 2 for imaging human limbs. Magnet 2 includes, in part, magnet cartridge assembly 4, High-Tc superconducting lead and magnet support assembly 100, thermal stations 118, 120, cold head sleeve assembly 150, and gradient coil/passive shimming assembly 200 and conventional cryocooler 300.

Figure 2:
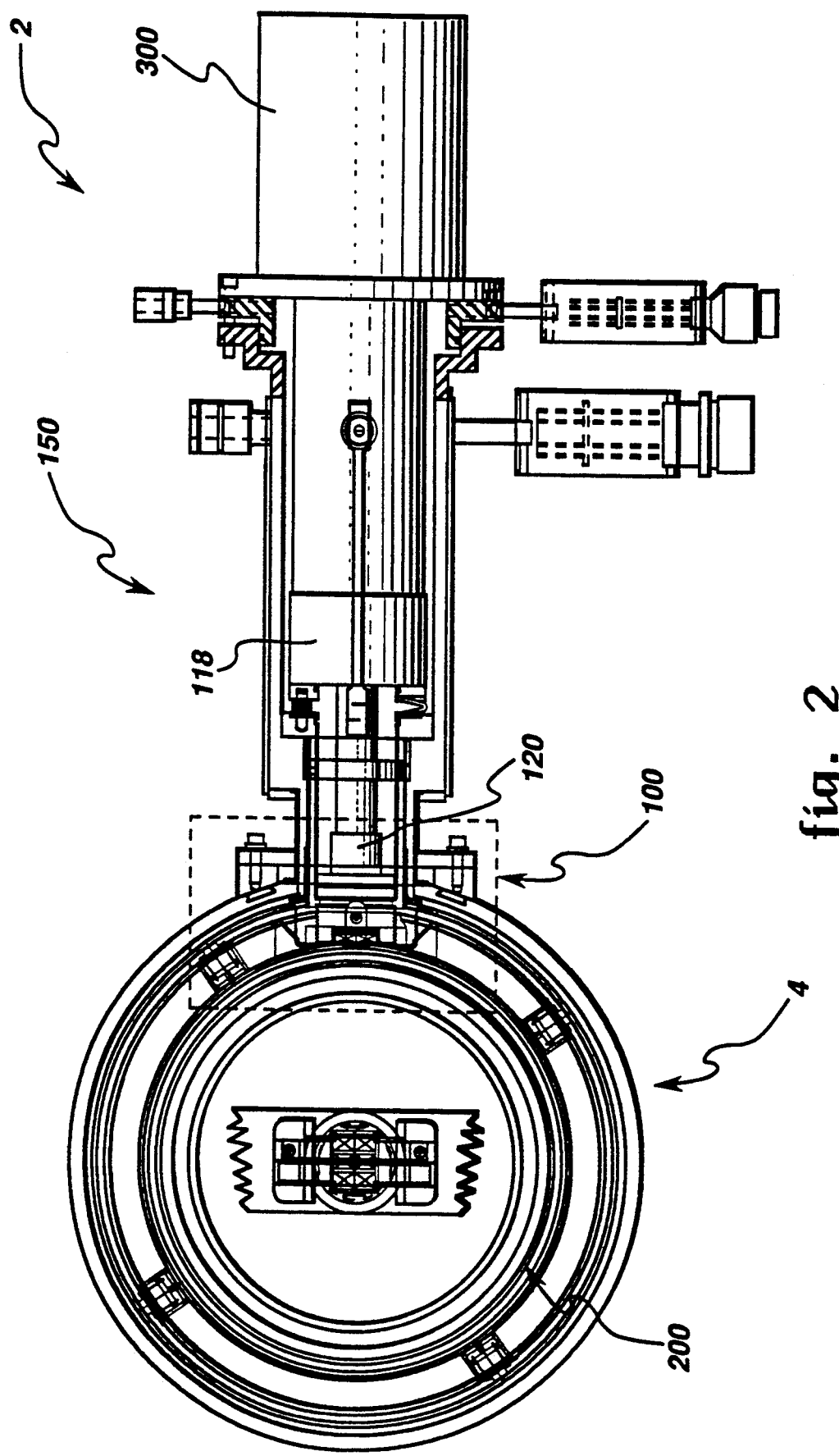
FIG. 2 is a side plan view of the eddy-current free, superconducting imaging magnet for imaging human limbs, according to the present invention.

FIG. 2 is an end view illustration of FIG. 1 in which magnet cartridge assembly 4, High-Tc superconducting lead and magnet support assembly 100, cold head sleeve assembly 150 and gradient coil/passive shim assembly 200 are also illustrated.

Figure 3:
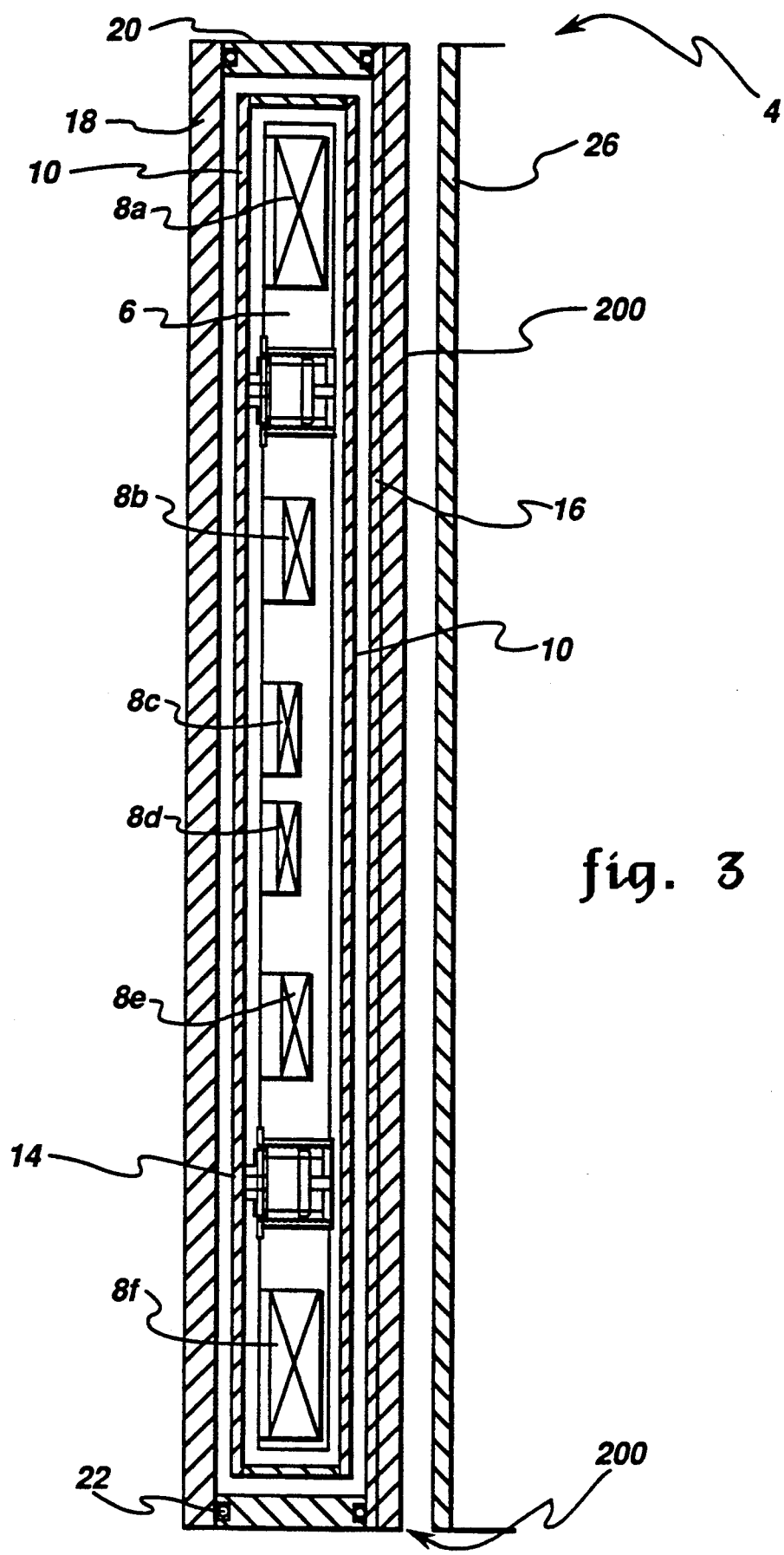
FIG. 3 is an expanded view of the mechanical support and thermal shield assembly for the eddy-current free, superconducting imaging magnet for imaging human limbs.

FIG. 3 is a detailed illustration of magnet cartridge assembly 4 as more generally shown in FIGS. 1 and 2. Magnet cartridge assembly 4 includes, in part, magnet cartridge 6, superconducting coils 8a-8f, thermal shield 10, radial shield supports 14, inner bore tube 16, vacuum enclosure 18, end plates 20, conventional elastomeric O-rings 22, RF coil 26, and gradient coil/shimming assembly 200. In particular, cartridge 6, preferably, is constructed of any suitable epoxy reinforced fiberglass with cooper wires 146 (FIG. 10) for axial thermal conduction. Coils 8a-8f are constructed of any suitable superconducting coil material. Thermal shield 10, preferably, is constructed of any suitable epoxy reinforced fiberglass material and copper wire. Bore tube 16, enclosure 18 and end plates 20, preferably, are constructed of any suitable epoxy reinforced material with stainless steel. Supports 14 are used to rigidly attach thermal shield 10 to cartridge 6 such that the heat transference from shield 10 to cartridge 6 can be minimized as magnet 2 is operating.

Figure 4:
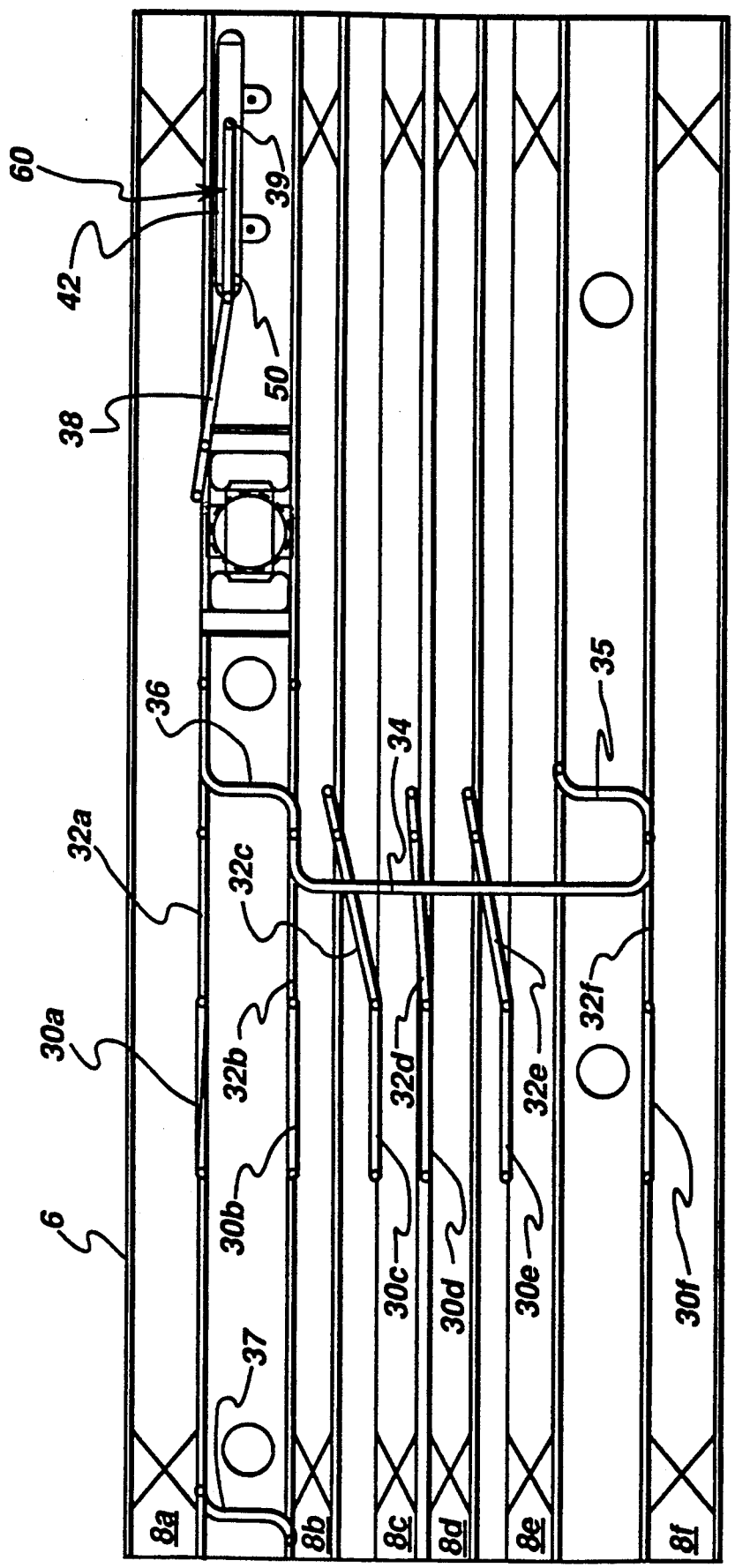
FIG. 4 is a detailed view of the coil form for the eddy-current free, superconducting imaging magnet for imaging human limbs, according to the present invention.

FIG. 4 illustrates in a plan view how conductor windings 8a-8f are wound on cartridge 6. In particular, conductor 42 which is initially located in switch assembly 60, is traversed along ramp 38 and wound by conventional winding techniques to form winding 8a. Conductor 42 then exits down ramps 30a and 32a to ramp 37. Conductor 42 then exits ramp 37 and enters ramps 30b and 32b to form winding 8b. Winding 8b is then formed by conventional winding techniques. After winding 8b is formed, conductor 42 then traverses along ramps 32c and 30c to form winding 8c. After conductor 42 leaves ramps 32c and 30c, winding 8c is formed by conventional winding techniques. After winding 8c is formed, conductor 42 traverses along ramps 32d and 30d to form winding 8d where winding 8d is formed by conventional winding techniques. After winding 8d is formed, conductor 42 then traverses along ramps 32e and 30e where winding 8e is formed by conventional winding techniques. After winding 8e is formed, conductor 42 then traverses along ramps 35, 32f and 30f where winding 8f is formed by conventional winding techniques.

After winding 8f is formed, conductor 42 then traverses along back ramp 36 and back along ramp 38 to form conductor end 50. A pigtail joint 39 is formed between conductors 42 and 50 in superconducting switch assembly 60.

With respect to FIGS. 5a-5f, there is illustrated the various steps for making the superconducting pigtail joint 39 in switch assembly 60. In particular, the operator measures the two conductors 42, 50 which make pigtail 39, to one inch longer than the end of switch assembly 60 and cuts conductors 42, 50. The operator then delaminates each conductor 42, 50 to 6⅛" back with a conventional delaminator and cuts with a conventional scarf. In this process, the operator also conventionally delaminates one inch of conductors 42, 50 in addition to 6⅛" in order to allow for the scarfing of the copper strip 44 and then while the chill blocks (not shown) are kept hot, partial relamination is done leaving some part of the copper 44 unlaminated (relaminate to ⅛" diameter pins), as shown in FIG. 5a. It is to be understood that for the sake of simplicity, only conductor 42 is initially illustrated until assembly 40 is almost completely assembled. The process is the same for conductor 50.

As shown in FIG. 5b, the operator cuts a 9 inch long, one mil thick stainless steel foil 46 with a scarf at one end, (two pieces per conductor). Next the operator measures at least 9 inches plus 3.5 inches (12.5 inches) from the end of conductors 42, 50 and marks this area to denote the beginning of the stainless steel lamination. The operator then positions the lower stainless steel foil 46 to the copper strip 44 with a conventional solder paste not shown). Then the operator positions the 12.5 inch mark to the end of the stainless steel foil 46 (non-scarfed end) The operator then hand solders for one inch while maintaining alignment of the stainless steel foil 46 and conductor 42 as shown in FIG. 5b. Next, the operator prepastes the top side of conductor 42 and then positions the top of the stainless steel 46 to the 12.5 inch mark and solders for 1 inch. The operator then positions this subassembly to a conventional relamination block (not shown) with ⅜ inch of the presoldered assembly outside of the relamination blocks. The operator heats up the relamination blocks to approximately 200° C. and starts the relamination process while maintaining the position of the stainless steel foil 46 (using wet conventional cotton swabs to prevent delamination of the ⅜ inch area). This relamination stops before the ends in order to keep the scarfs from soldering to the conductor 42.

With respect to FIG. 5c, a length of Kapton ® 48 for insulation is cut and attached to the bottom side of the upper conductor 42. The operator starts the Kapton ® 48 at 3¼ inches from the end of conductor 42. This point is on the loose part of the scarf of the stainless steel foil 46. The operator then gently presses down for proper contact. Finally, the operator trims both sides for the entire length as close as possible. Additional pieces of Kapton ® 48 may be necessary for the rest of the length.

With respect to FIG. 5d, the operator positions both conductors 42, 50 in the relamination blocks while maintaining complete alignment (the un-scarfed end of the stainless steel 46 can be used for this alignment). The operator then starts with the stainless steel foil 46 in the blocks, heats the relamination blocks to approximately 200° C. and pulls assembly 40 through the relamination blocks, stopping before the stainless steel foil 46 leaves the blocks (to approximately 1 inch of the stainless steel part in the blocks).

With respect to FIG. 5e, the operator then cools the system 40 down and removes the cover and face plate (not shown) before trying to remove superconductor assembly 40 from the block. The operator then positions the superconductor assembly 40 in the slot guide (not shown) to finish soldering (by hand). If conductors 42, 50 are misaligned, the operator merely has to solder them outside of the slot guide. The operator then positions the 1 inch (from the end) and the 2¼ inch mark to the tapers of the welding chill block (not shown). This will ensure a location of weld 52 which will be approximately 1¼ inch long and 1 inch from the end of conductors 42, 50. The operator then makes a conventional superconducting weld 52. It is to be understood that all markings should be done with a soft, blunt marker without pressure.

With respect to FIG. 5f, the operator carefully cuts the end of conductors 42, 50 to about 1/16 inch from weld 52 (not cutting any outer region). This is approximately 1 inch. The operator then cuts two pieces of stainless steel 54, each about 3 inches long, scarfing only one end of each. The operator then prepastes one stainless steel piece 54 which is positioned to the heat block (not shown) on the scarfed end towards the front of the heat block. The operator then positions an end of weld 52 to line up with the un-scarfed stainless steel piece 54. The operator prepastes a second stainless steel piece 54, maintaining scarfs in opposite directions, and another piece 54 is positioned on weld 52 similar to the lower piece. Next the operator positions the heat block cover (not shown) and carefully tightens with a conventional spring loaded screw. This assembly is heated to approximately 200° C. and held for 30 seconds. The heating is then stopped and the assembly is cooled. Finally, the operator disassembles the cover, removes the front plate to remove the weld 52, and removes superconductor assembly 40 which includes pigtail joint 39. It is to be understood if any sticking occurs, the operator merely has to apply alcohol to breakdown the fluxes.

Figure 6A:
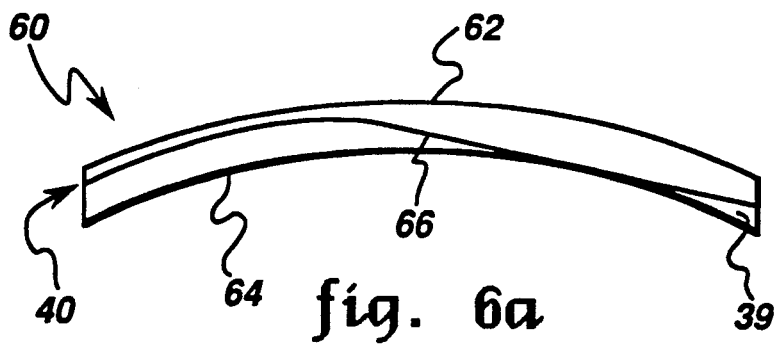
FIGS. 6a and 6b illustrate a side view and an end view, respectively of a housing for a persistent superconducting switch for the eddy-current free, superconducting imaging magnet for imaging human limbs, according to the present invention.

Once pigtail joint 39 is formed in superconducting assembly 40, assembly 40 is placed in persistent superconducting switch assembly 60 as shown in FIG. 6a. Assembly 60 includes, in part, top cover 62, bottom plate 64 and conductor groove 66. Top cover 62 and bottom plate 64, preferably, are constructed of copper. Groove 66, preferably, is machined in assembly 60 by conventional machining techniques.

Figure 6B:

With respect to FIG. 6b, there is illustrated an end view of switch assembly 60 that was previously illustrated in FIG. 6a. As can be seen in FIG. 6b, assembly 60 includes top cover 62, bottom plate 64 and conductor groove 66.

Figure 7A:
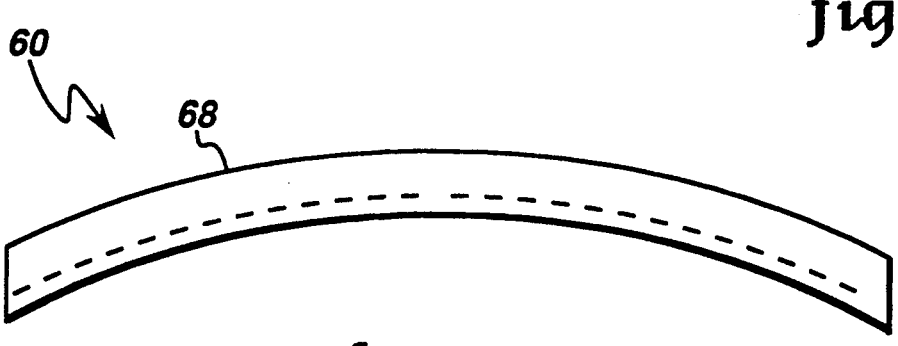
FIGS. 7a and 7b illustrate a side view and an end view, respectively, of a holder for the persistent superconducting switch for the eddy-current free, superconducting imaging magnet for imaging human limbs, according to the present invention.
Figure 7B:
Figure 8:
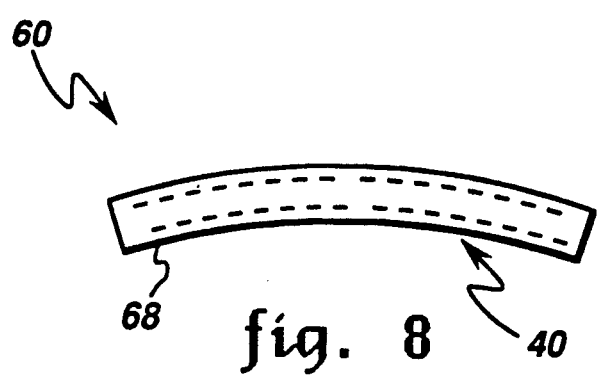
FIG. 8 illustrates the complete persistent superconducting switch for the eddy-current free, superconducting imaging magnet for imaging human limbs, according to the present invention.

After superconductor assembly 40 is placed within switch assembly 60, this assembly is then placed into holder 68 (FIG. 7a) as shown in FIG. 8. Holder 68 is a U-shaped holder as shown in FIG. 7b and is constructed, preferably, of any suitable epoxy-reinforced fiberglass.

As shown in FIG. 8, once superconducting assembly 40 is placed within assembly 68 and holder 68, persistent superconducting switch assembly 60 is formed. This persistent superconducting switch assembly 60 is then rigidly attached to cartridge 6 by conventional fasteners as shown in FIG. 4.

The uniqueness of switch assembly 60 will now be described. In order to allow a superconducting magnet to assume a persistent mode of operation, a superconducting switch must be installed in parallel to the magnet and the power supply which is used to ramp the magnet. During ramping, the superconducting switch 60 is heated up to above its transition temperature, therefore, it will be in the normal resistive state. The current from the power supply is fed into the superconducting magnet 2. If the superconducting magnet inductance is L, the final electric current to be supplied to the magnet is I, and the duration of time in which the magnet should be ramped is t, then the voltage that the power supply needs to be set at is:

$$V = LI/t. \qquad (1)$$

This voltage (V) is directly imposed across the superconducting switch assembly 60, as well. If the normal state resistance of the switch assembly 60 is R, then the heating in the switch assembly 60 from this voltage is:

$$V^2/R. \qquad (2)$$

In order to prevent the superconducting switch assembly 60 from overheating, this heating rate has to be small which means that R, the normal state resistance of the switch assembly 60 is to be large.

Once magnet 2 reaches its designed electrical current, the voltage is reduced to zero (a very small value to compensate for resistive losses in the current lead assembly 100 (FIG. 1)) and the superconducting switch assembly 60 is allowed to cool down and assume superconducting state. Once in the superconducting state, the power supply (not shown) is removed and a magnet 2 is in persistent mode. In order to achieve a timely cooldown of the switch assembly 60, its thermal mass has to be sufficiently small. Thus, in this invention, the length of the conductor 42, 50 (FIGS. 5a-5f) which has stainless steel lamination 46, 54, will act as the superconducting switch assembly 60 (FIG. 8). This length of the conductor, 42, 50, which is about 6 to 8 inches, has a large enough resistance to allow the ramping of the magnet 2 to occur in about 20 minutes.

A protection scheme is devised to ensure the survival of the superconducting switch 60. Two scenarios can cause the magnet 2 to dump its entire energy, which is approximately 4 KJ, into the superconducting switch 60. First, if during the ramping of the magnet 2, one or both current leads fail and burn (open), all the magnet energy will be dumped into the switch assembly 60. Second, if during the persistent mode of operation, due to any cause the superconducting switch 60 quenches, i.e. becomes resistive, all of the magnet 2 energy will be dumped into the switch assembly 60.

In order to protect the superconducting switch 60 from burning, a resistive shunt made out of brass (not shown) is electrically attached in parallel to the magnet 2 and to the superconducting switch 60. This brass shunt has a length of approximately 70 inches, width of about 1.3 inch and a thickness of 10 mils. This brass shunt is thermally attached to the magnet 2 station. Due to its resistance ratio, this brass shunt absorbs more than 90% of the magnet energy, thereby protecting the superconducting switch 60 from burning.

Figure 9:
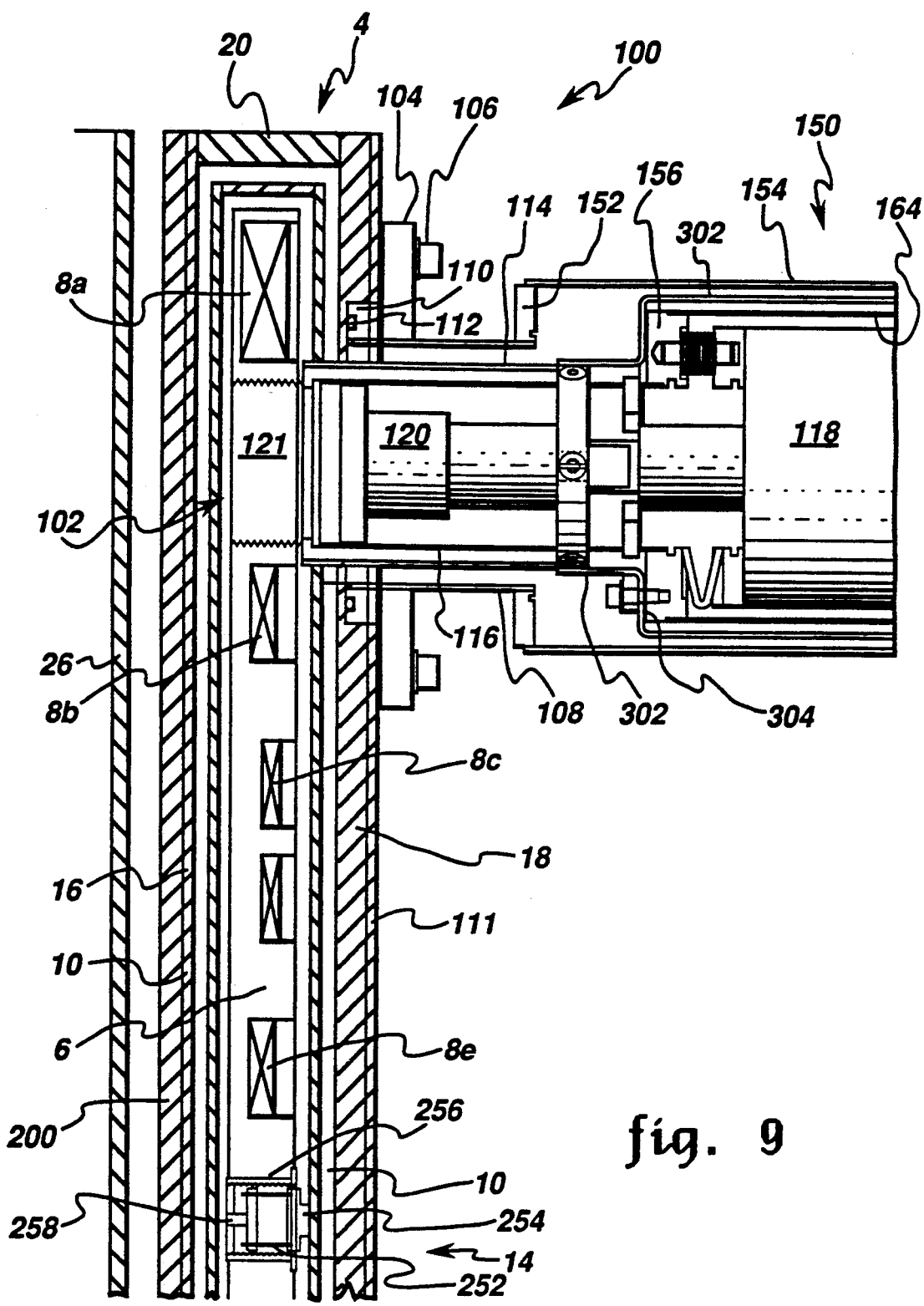
FIG. 9 is an expanded view of a magnet support assembly for the eddy-current free, superconducting imaging magnet for imaging human limbs taken from FIG. 1, according to the present invention.
Figure 10:
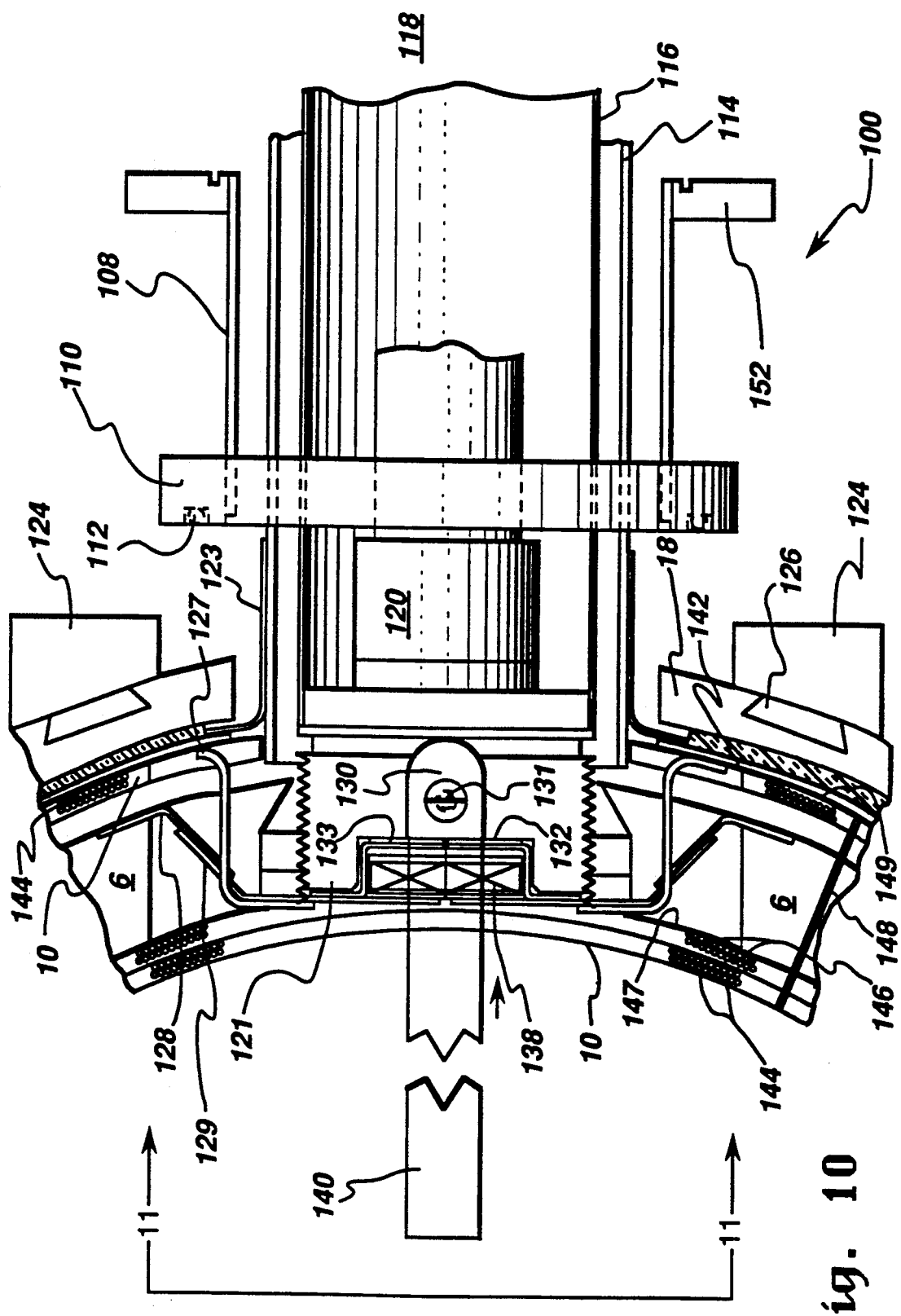
FIG. 10 is an expanded view of a HIgh-Tc superconducting lead assembly for the eddy-current free, superconducting imaging magnet for imaging human limbs taken from FIG. 2, according to the present invention.

FIG. 9 illustrates High-Tc lead and magnet support assembly 100. Assembly 100 includes, in part, magnet cartridge assembly 4, radial shield supports 14, flange 104, tubes 108, 114 and 116, thermal stages 118, 120, connector 121, support tubes 154, 164, flange 152, instrument tube 168 (FIG. 12), and passive shim/gradient shield assembly 200. In particular, flange 104, preferably, is constructed of non-magnetic stainless steel (NMSS). Flange 104 is rigidly attached to vacuum enclosure 18 by rails 124 (FIG. 10). Tube 108 which, preferably, is constructed of NMSS is rigidly attached to flange 110 by a conventional weldment (not shown). Flange 110, preferably, is constructed of NMSS. Located between flange 110 and enclosure 18 is a conventional elastomeric O-ring 112. Tube 114, preferably, is constructed of OFHC copper and is rigidly attached to thermal shield 10 by thermal connectors 123 (FIG. 10). Tube 116, preferably, is constructed of NMSS and is rigidly attached to connector 121 by a conventional braze joint (not shown). Connector 121, preferably, is constructed of OFHC copper. Tube 114 is rigidly attached to thermal lead 302 by a conventional solder joint (not shown). Thermal lead 302 preferably, is constructed of OFHC copper. Thermal lead 302 is rigidly attached to dielectric interface 304 by a conventional solder joint (not shown). Interface 304, preferably, is constructed of nickel-plated beryllia. Interface 304 is rigidly attached to flange 156 by a conventional solder joint (not shown).

Tube 116 is attached to flange 156 (FIG. 12) by a conventional braze joint. Tube 164 is attached to flange 156 by a conventional braze joint and flange 172 (FIG. 12) by a conventional weldment. Flange 172 in connected to instrument tube 168 by a conventional weldment. Instrument tube 168 is connected to tube 154 by a conventional weldment. The magnet cartridge 6 is thereby rigidly supported by vacuum enclosure 18.

With respect to radial shield supports 14, supports 14 number four and include, in part, support tube 252, shield contact 254, support housing 256 and support adjustment 258. Tube 252, preferably, is constructed of epoxy reinforced fiberglass. Contact 254, housing 256 and support adjustment 290, preferably, are constructed of brass. Support housing 256 is embedded in magnet cartridge 6 and held by a conventional adhesive. Housing 256 is threaded by conventional threading techniques on its inner diameter and support tube 252 is threaded on its outer diameter by conventional threading techniques to mate with housing 256. Support tube 252 is also threaded on its inner diameter by conventional threading techniques and contact 254 is threaded by conventional threading techniques on its outer diameter to mate with support tube 252. Contact 254 is adhered to tube 252 by a conventional adhesive. Support adjustment 258 is rigidly attached to tube 252 by a conventional adhesive.

In order to adjust the position of shield 10 with respect to cartridge 6, the operator rotates support adjustment 258 to radially raise or lower the position of shield 10. Supports 14 provides a low profile, low heat leak shield support.

FIG. 10 illustrates a view of the High-Tc superconducting lead assembly 100. As shown in FIG. 10, the assembly 100 includes, in part, magnet cartridge 6, thermal shield 10, vacuum enclosure 18, tubes 108, 114, 116, flange 110, thermal stages 118, 120, rails 124, thermal connectors 123, 127, 128, 129, connectors 121, and High-Tc lead 138. In particular, thermal connectors 123, preferably, are constructed of copper and are rigidly attached to tube 114 and thermal shield 10 by conventional solder joints (not shown). Connectors 121, preferably, are constructed of copper and are rigidly attached to magnet cartridge 6 by conventional threaded fasteners and a conventional adhesive (not shown). Rails 124, preferably, are constructed of NMSS and are rigidly retained in vacuum enclosure 18 by slots 126. Slots 126 are machined in enclosure 18 by conventional machining techniques. 50K connectors 127 are rigidly attached to thermal shield 10 and connectors 141 by conventional solder joints (not shown). Connector 127, preferably, are constructed of OFHC copper. 10K connectors 128 are rigidly attached to magnet cartridge 6 by conventional solder joints (not shown). Connectors 129 are rigidly attached to connectors 128 and High-Tc leads 138 by conventional soldering. Dielectrics 132 are rigidly attached to connector 121 by conventional solder joints (not shown). Dielectrics 132, preferably, are constructed of nickel-plated beryllia. Soldered to dielectrics 132 are heat stations 133. Heat stations 133, preferably, are constructed of copper. Heat stations 133 are rigidly attached to connectors 129 by a conventional solder joint (not shown). High-Tc leads 138 are rigidly attached to connectors 141 by a conventional solder joint (not show). Leads 138, preferably, are constructed of any suitable High-Tc ceramic superconducting material. Thermal connectors 140 are rigidly attached between connector 121 and cartridge 6 by solder joints (not shown). Connectors 140, preferably, are constructed of OFHR copper.

With respect to the eddy-current free nature of magnet 2, U.S. patent application Ser. No. 07/759,389, now allowed U.S. Pat. No. 5,225,782, entitled "Eddy Current Free MRI Magnet With Integrated Coil", to Laskaris et al. and assigned to the same assignee describes the nature of the eddy current free technology by teaching that the gradient shield coils may be eliminated in an MRI magnet if all magnet members located on the OD of the gradient coils are constructed such that no eddy current coupling due to the pulsation of the gradient coils can occur. More specifically, no metallic members of low electrical resistance and any substantial width can exist on the magnet enclosure, thermal shield, or magnet cartridge. In particular, calculations are performed to ensure that the eddy current heating as well as the time constants due to eddy current coupling are acceptable for any metallic member which has to be included in the above-mentioned structures.

In cryogen-free conduction cooled magnets, metallic members of high thermal conductivity such as copper or aluminum are used in the construction of the magnet cartridge and thermal shields in order to attain uniform temperatures. In other words, since cooling of the magnet and the thermal shields are done from one location, i.e. cryocooler interface, other areas on the magnet cartridge and thermal shields will not be cooled efficiently unless proper thermal paths are established.

In the present invention, axial thermal conduction in magnet cartridge 6 as well as thermal shield 10 is achieved by attaching by conventional techniques layers of thin, insulated copper wires 142, 144, 146 (approximately 0.010 inches in diameter). These wires 142, 144, 146 are closely placed around the circumference of the magnet cartridge 6 and the thermal shield 10, respectively. Wires 144 and 146 run axially from one end to the other end of these members and wires 142 run circumferentially around the thermal shield 10. In particular, wires 142 and 144 are coupled with thermal shield 10 and wires 146 are coupled with cartridge 6.

Circumferential thermal conduction in the magnet cartridge 6 is mostly enhanced by the presence of the superconducting coils 8a–8f. This is due to the fact that these coils 8a-8f are wound with superconducting conductors with copper stabilizer and therefore, the copper stabilizer will contribute to the circumferential thermal conduction. A few, in this case four, thin copper bands 147 of about 0.5 inches width and 0.010 inches thick are attached circumferentially to the magnet cartridge 6 in the location where the cryocooler interface is connected. This is to establish direct thermal communication from the cryocooler 300 to all axial copper wires.

For the thermal shield 10, circumferential copper wires 142 are attached similarly by conventional epoxy joints (not shown) to the axial copper wires 144 for improved thermal conduction. In addition, a multitude of copper tabs 148 of 0.5 inches wide and 0.010 inches thick thermally connect the inner and the outer thermal shield 10 by conventional solder joints (not shown). Finally, two circumferential copper strips 149 of approimately 0.5 inches wide and about 0.040 inches thick thermally connect the thermal shield 10 and the first stage 120 of the cryocooler 300 by conventional solder joints (not shown).

The system mentioned above is an efficient eddy-current free, conduction cooled magnet 2 which provides temperature uniformity on the magnet cartridge 6 and thermal shield 10. At the same time, this magnet 2 has small enough eddy current coupling to the gradient coils 200 which the eddy current heating as well as image distortions are minimum.

Figure 11:
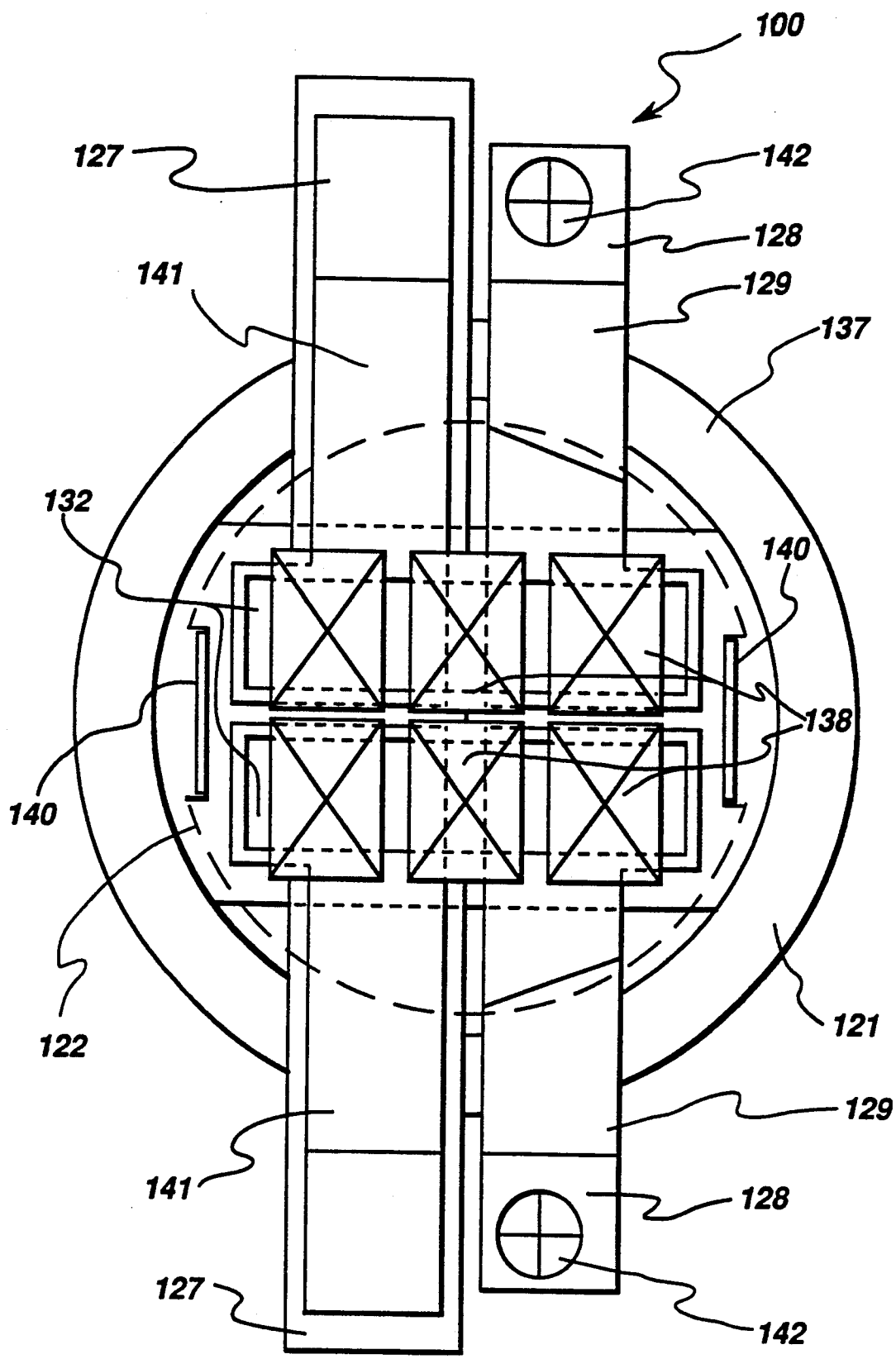
FIG. 11 is an end plan view of the High-Tc superconducting lead assembly for the eddy-current free, superconducting imaging magnet for imaging human limbs taken along line 11—11 of FIG. 10, according to the present invention.

With respect to FIG. 11, there is shown a bottom view of superconducting lead assembly 100 taken along lines 11—11 of FIG. 10. In particular, lead assembly 100 includes, in part, connector 121, thermal connectors 127, 128, 129, 140 dielectrics 132, High-Tc leads 138, thermal connectors 141, and fasteners 142. In particular, thermal connectors 141, preferably, are constructed of copper and are rigidly attached to thermal connectors 127 by conventional solder joints (not shown). Conventional fasteners 142 are used to attach 10K connectors 128 and 129. Connector 129 is rigidly attached to heat station 133 (FIG. 10) by a conventional solder joint (not shown).

Figure 12:
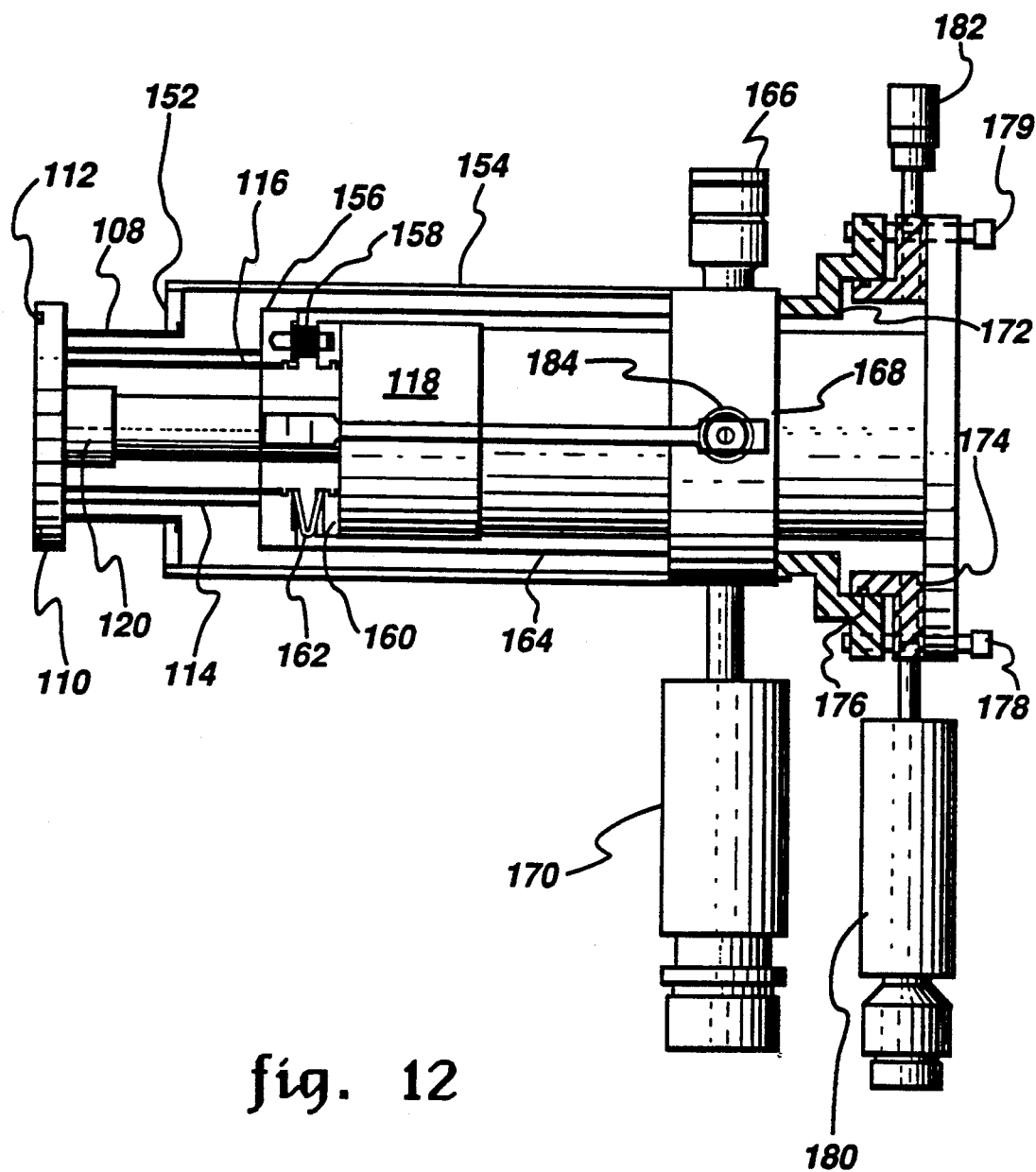
FIG. 12 is a side plan view of the cold head sleeve assembly for the eddy-current free, superconducting imaging magnet for imaging human limbs, according to the present invention.

FIG. 12 illustrates cold head sleeve assembly 150. Assembly 150 includes, in part, tube 108, flange 110, flange 152, tube 154, flange 156, Belleville washer assembly 158, thermal connection 162, tube 164, conventional seal off valve 166, instrument tube 168, conventional connector 170, 300K flange 172, flange 174, conventional connector 180, conventional seal off valve 182 and conventional current lead 184. In particular, flange 152, preferably, is constructed of NMSS and is rigidly attached to tube 108 by a conventional weldment (not shown). Tube 154, preferably, is constructed of NMSS and is rigidly attached to flange 152 and tube 168 by conventional weldments (not shown). Located within tube 154 is tube 164. Tube 164, preferably, is constructed of NMSS. Tube 164 is rigidly attached to flange 172 by conventional weldments (not shown). Tube 164 is rigidly attached to flange 156 by a conventional braze joint (not shown). Flanges 156 and 160, preferably, are constructed of OFHC copper. A conventional Belleville washer assembly 158 is rigidly attached to flanges 156 and 160 by a conventional press fit. Thermal connection 162 is rigidly attached to flanges 156 and 160 by conventional weldments (not shown). A conventional seal off valve 166 is rigidly attached to tube 168 by a conventional weldment. A conventional connector 170 is rigidly attached to tube 168 by conventional weldment. Flange 172 is rigidly attached to tube 168 by a conventional weldment (not shown). Located between flange 172 and flange 174 is a conventional elastomeric O-ring 176. Flanges 172, 174, preferably, are constructed of NMSS. A conventional jacking screw 178 is used to lift flange 174 away from flange 172 such that thermal stations 118 and 120 (FIG. 1) become thermally detached from flange 160 and connector 121. Conventional connector 180 is rigidly attached to flange 174 by a conventional weldment (not shown). Conventional seal off valve 182 is rigidly attached to flange 174 by a conventional weldment (not shown). Conventional current lead 184 is rigidly attached to tube 168 by a conventional weldment (not shown).

During the operation of cold head sleeve assembly 150, conventional fastener 179 is rotated such that cold head first stage 118 contacts flange 160 and spring assembly 158. Heat from shield 10 (FIG. 3) is conducted along tube 114 to thermal connectors 162 directly to the cryocooler 300. Heat from cartridge 6 (FIG. 3) flows through connector 121 to second stage 120 directly to the cryocooler 300.

Figure 13:
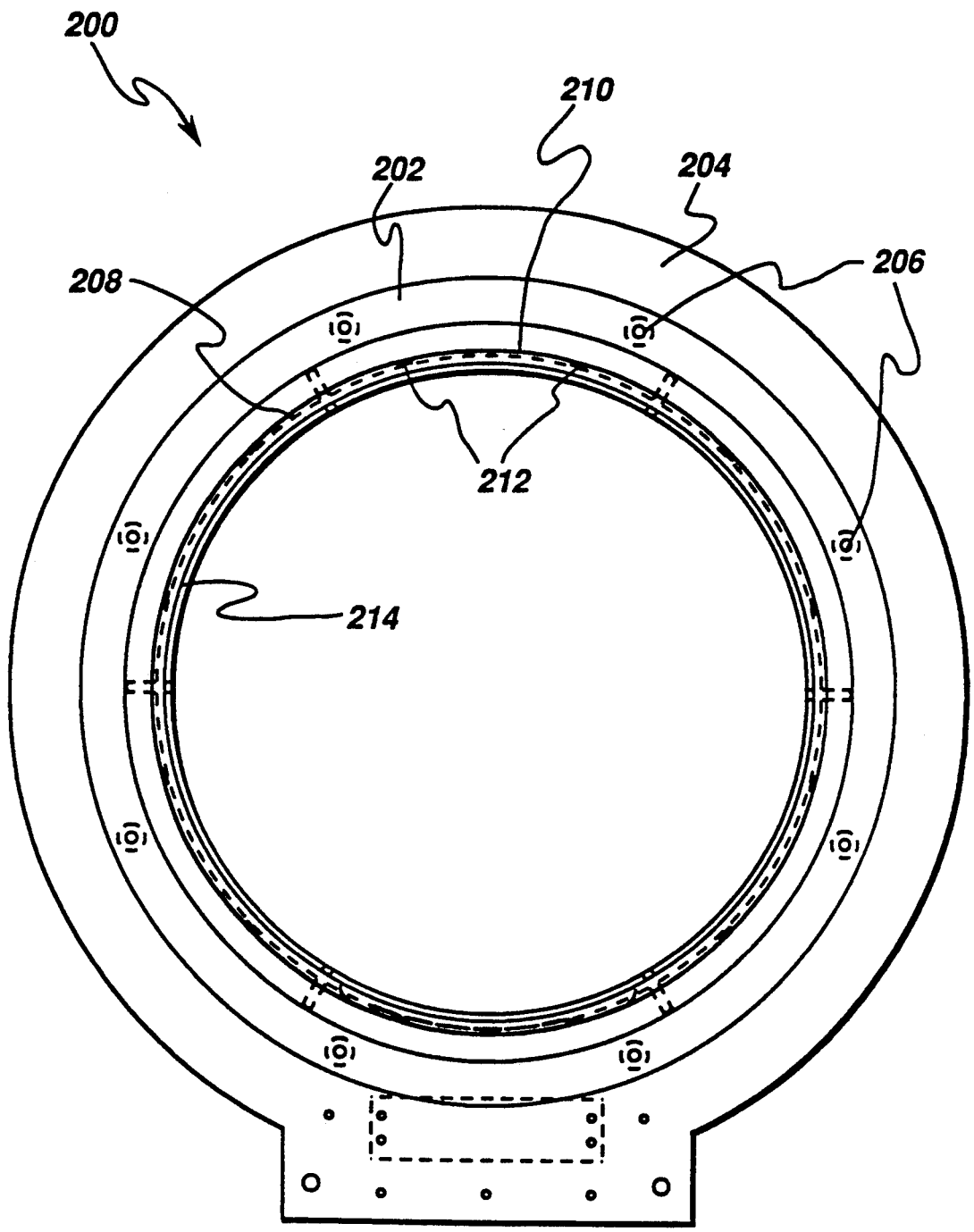
FIG. 13 is an end view of the passive shim/gradient coil form assembly for the eddy-current free, superconducting imaging magnet for imaging human limbs, according to the present invention.

FIG. 13 illustrates an end view of passive shim/gradient coil assembly 200. Assembly 200 includes, in part, end ring 202, support plate 204, shimming assembly 210, axial grooves 212 and gradient coil assembly 214. In particular, ring 202, preferably, is constructed of aluminum and is rigidly attached to support 204 by conventional fasteners 206. Support 204, preferably, is constructed of any suitable epoxy-reinforced fiber glass material. Ring 202 is rigidly attached to support 204 in order to slide passive shim/gradient coil assembly 200 in and out of magnet 2. After the magnet 2 is fully shimmed, ring 202 is removed. Grooves 212 are machined by conventional machining techniques. Gradient coil 214 includes conventional X, Y, Z finger-print gradient coils over which the passive shimming assembly 210 is assembled.

Figure 14:
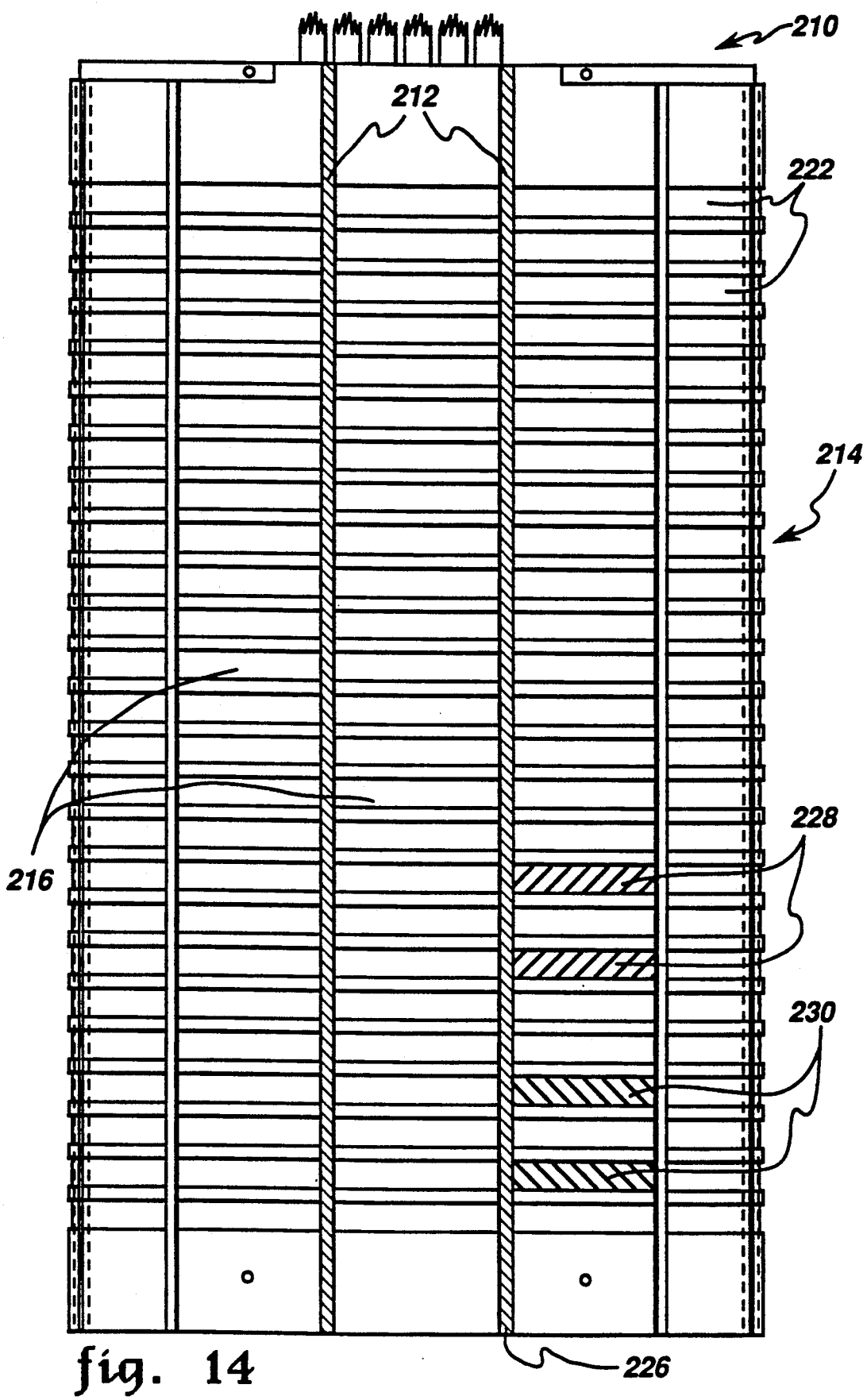
FIG. 14, illustrates a top view the passive shim/gradient coil form assembly of FIG. 13 without the end ring attached.

With respect to FIG. 14, there is illustrated passive shim assembly 210. Shim assembly 210 includes, in part, grooves 212, 222, shimming locations 216, shims 228, and shim covers 230. In particular, shimming assembly 210 includes twelve axial grooves 212 and twenty-five circumferential grooves 222 which are machined into the outer diameter of the gradient coil 214 by conventional machining techniques. Consequently, due to the number of grooves 212 and 222, there are 300 locations in which shims 228 can be located. Located in grooves 212 on the shimming assembly 210 are axial pieces 226. Pieces 226, preferably, are constructed of any suitable epoxy-reinforced fiberglass material. These pieces create pockets for passive shims 228 at the 300 locations. Shims 228, preferably, are constructed of any suitable carbonaceous steel material. Shim covers 230, preferably, are constructed of brass.

The passive shims 228 are designed to be placed between the gradient coil 214 and the inner bore of magnet 2. It is calculated that 0.050 inch thick steel shims 228 is maximum thickness needed to homogenize the field errors of magnet 2. In order to comply with the least amount of space, passive shim hardware is combined with the gradient coil 214 to form assembly 200. In other words, once the gradient coil 214 is manufactured, allowances are made for the passive shim assembly 210 on the outer diameter of gradient coil 214. The assembly 200 includes a cylinder which is stacked with X, Y and Z gradient fingerprint coils 214 (FIG. 13). With this assembly, about 0.070 inch of fiber glass 208 is wound and the whole cylinder is then epoxy impregnated. For the magnet 2, the inner diameter of the assembly 200 is 9.056 inches and its outer diameter is 9.615 inches. The magnet's warm bore has an inner diameter of 9.625 inches. Twenty-five circumferential grooves 222 are machined by conventional machining techniques on the outer diameter of the gradient coil assembly 214. These grooves, preferably, are 0.051 inch deep and 0.39 inch wide. Twelve axial grooves 212 are also machined by conventional machining techniques on the outer diameter of gradient coil 214 and epoxy reinforced fiberglass pieces 226 are glued by a conventional adhesive in place. This will provide 300 shim locations which is equivalent to a conventional whole body magnetic resonance imaging system. Passive shims 228 are approximately 2.281 inches long, 0.375 inch wide and 0.001 to 0.003 inch thick and are placed within several predetermined locations. Passive shim covers 230 of similar width and length and a thickness of 0.005 inch are used to cover the shims 228. Adhesive tape such as Kapton ® are used to keep the shims 228 and shim covers 230 in place. The gradient coil/passive shim cylinder assembly 200 is fitted with a temporary aluminum ring 202. This ring, as discussed earlier, allows for shimming iterations, i.e., to pull the cylinder in and out for placing the shims and to push it back in.

With respect to the shim configuration, a previously patent and method, U.S. Pat. No. 5,045,794, entitled "Method of Optimizing Passive Shim Placement of Magnet Resonance Magnets", to Dorri et al. and assigned to the same assignee as the present invention can be used to determine the amount and location of the passive shims for which the PPM inhomogeneity is minimized.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. An eddy-current free, superconducting imaging magnet for imaging human limbs, wherein said magnet is comprised of:
    a superconducting coil means operatively connected to a cartridge means;
    a thermal shield means operatively connected to and substantially surrounding said cartridge means;
    a vacuum enclosure tube means which includes a bore tube and substantially surrounds said thermal shield means;
    a gradient coil/passive shimming means operatively connected to said bore tube means;
    a RF shield means operatively connected to said gradient coil/passive shimming means;
    a RF coil means located at a predetermined distance away from said RF shield means such that said RF coil means substantially surrounds a relatively small imaging volume;
    a cooling means operatively connected to said cartridge means and said thermal shield means; and
    a superconducting lead means for energizing said magnet.

2. The magnet, as in claim 1, wherein said vacuum enclosure means is comprised of:
    fiberglass reinforced epoxy.

3. The magnet, as in claim 1, wherein said cartridge means is further comprised of:
    an epoxy-reinforced fiberglass and copper wires.

4. The magnet, as in claim 1, wherein said thermal shield means is further comprised of:
    an epoxy-reinforced fiberglass material and copper wires.

5. The magnet, as in claim 2, wherein said imaging volume is approximately 10 centimeters in diameter.

6. The magnet, as in claim 1, wherein said imaging volume has an inhomogeneity of approximately 2.5 ppm.

7. The magnet, as in claim 1, wherein said magnet is further comprised of:
    an inner diameter of approximately 27.8 centimeters.

8. The magnet, as in claim 1, wherein said magnet has an inductance of approximately 0.42 henries.

9. The magnet, as in claim 1, wherein said superconducting coil means is further comprised of:
    a switch means.

10. The magnet, as in claim 1, wherein said cooling means is further comprised of:
    a cryocooler.

11. The magnet, as in claim 1, wherein said superconducting coil means is further comprised of:
    at least six superconducting coils; and
    a ramp means operatively connected between said coils.

* * * * *